(12) United States Patent
Yamazaki et al.

(10) Patent No.: US 6,478,263 B1
(45) Date of Patent: *Nov. 12, 2002

(54) SEMICONDUCTOR DEVICE AND ITS MANUFACTURING METHOD

(75) Inventors: Shunpei Yamazaki, Tokyo; Satoshi Teramoto; Jun Koyama, both of Kanagawa; Yasushi Ogata, Kanagawa; Masahiko Hayakawa, Kanagawa; Mitsuaki Osame, Kanagawa; Hisashi Ohtani, Kanagawa; Toshiji Hamatani, Kanagawa, all of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/428,471

(22) Filed: Oct. 28, 1999

Related U.S. Application Data

(62) Division of application No. 08/785,536, filed on Jan. 17, 1997, now Pat. No. 6,093,934.

(51) Int. Cl.$^7$ ................................................ H01L 29/04
(52) U.S. Cl. .......................... 247/51; 257/51; 257/347; 257/348; 257/349; 257/350; 257/351; 257/352; 257/353; 257/354; 257/355
(58) Field of Search ...................... 257/49–66, 347–355

(56) References Cited

U.S. PATENT DOCUMENTS

| | | |
|---|---|---|
| 3,389,024 A | 6/1968 | Schimmer |
| 3,783,049 A | 1/1974 | Sandera |
| RE28,385 E | 4/1975 | Mayer |
| RE28,386 E | 4/1975 | Heiman et al. |
| 3,890,632 A | 6/1975 | Ham et al. |
| 4,059,461 A | 11/1977 | Fan et al. |
| 4,068,020 A | 1/1978 | Reuschel |
| 4,132,571 A | 1/1979 | Cuomo et al. |
| 4,174,217 A | 11/1979 | Flatley |
| 4,226,898 A | 10/1980 | Ovshinsky et al. |
| 4,231,809 A | 11/1980 | Schmidt |
| 4,271,422 A | 6/1981 | Ipri |
| 4,277,884 A | 7/1981 | Hsu |
| 4,300,989 A | 11/1981 | Chang |
| 4,309,224 A | 1/1982 | Shibata |
| 4,330,363 A | 5/1982 | Biegesen et al. |

(List continued on next page.)

FOREIGN PATENT DOCUMENTS

| | | |
|---|---|---|
| EP | 178447 | 9/1984 |
| JP | 60-105216 | 10/1985 |
| JP | 61-063017 | 4/1986 |

(List continued on next page.)

OTHER PUBLICATIONS

Baker, Jr. et al., "Field Effect Transistor", pp. 849, 1968, IBM Technical Disclosure Bulletin, vol. 11, No. 7.

(List continued on next page.)

*Primary Examiner*—Fetsum Abraham
(74) *Attorney, Agent, or Firm*—Eric J. Robinson; Robinson Intellectual Property Law Office, PC

(57) ABSTRACT

Nickel is selectively held in contact with a particular region of an amorphous silicon film. Crystal growth parallel with a substrate is effected by performing a heat treatment. A thermal oxidation film is formed on the silicon film by performing a heat treatment in an oxidizing atmosphere containing a halogen element. During this step, in the silicon film, impurities included such as oxygen or chlorine, are segregated with extending along the crystal growth, the crystallinity is improved, and the gettering of nickel element proceeds. A thin-film transistor is formed so that the direction connecting source and drain regions coincides with the above crystal growth direction. As a result, a TFT having superior characteristics such as a mobility larger than 200 cm$^2$/Vs and an S value smaller than 100 mV/dec. can be obtained.

30 Claims, 10 Drawing Sheets

U.S. PATENT DOCUMENTS

| | | |
|---|---|---|
| 4,331,709 A | 5/1982 | Risch et al. |
| 4,379,020 A | 4/1983 | Glaeser et al. |
| 4,409,724 A | 10/1983 | Tasch, Jr. et al. |
| 4,466,073 A | 8/1984 | Boyan et al. |
| 4,472,458 A | 9/1984 | Sirinyan et al. |
| 4,481,121 A | 11/1984 | Barthel |
| 4,534,820 A | 8/1985 | Mori et al. |
| 4,544,418 A | 10/1985 | Gibbons |
| 4,546,376 A | 10/1985 | Nakata et al. |
| 4,597,160 A | 7/1986 | Ipri |
| 4,634,473 A | 1/1987 | Swartz et al. |
| 4,735,824 A | 4/1988 | Yamabe et al. |
| 4,755,481 A | 7/1988 | Faraone |
| 4,911,781 A | 3/1990 | Fox et al. |
| 4,959,247 A | 9/1990 | Moser et al. |
| 4,959,700 A | 9/1990 | Yamazaki |
| 4,996,077 A | 2/1991 | Moslehi et al. |
| 4,996,523 A | 2/1991 | Bell et al. |
| 5,043,224 A | 8/1991 | Jaccodine et al. |
| 5,075,259 A | 12/1991 | Moran |
| 5,089,441 A | 2/1992 | Moslehi |
| 5,112,764 A | 5/1992 | Mitra et al. |
| 5,145,808 A | 9/1992 | Sameshima et al. |
| 5,147,826 A | 9/1992 | Liu et al. |
| 5,173,446 A | 12/1992 | Asakawa et al. |
| 5,200,630 A | 4/1993 | Nakamura et al. |
| 5,221,423 A | 6/1993 | Sugino et al. |
| 5,225,355 A | 7/1993 | Sugino et al. |
| 5,244,836 A | 9/1993 | Lim |
| 5,254,480 A | 10/1993 | Tran |
| 5,262,350 A | 11/1993 | Yamazaki et al. |
| 5,262,654 A | 11/1993 | Yamazaki |
| 5,275,851 A | 1/1994 | Fonash |
| 5,278,093 A | 1/1994 | Yonehara |
| 5,289,030 A | 2/1994 | Yamazaki |
| 5,296,405 A | 3/1994 | Yamazaki et al. |
| 5,298,075 A | 3/1994 | Lagendijk et al. |
| 5,308,998 A | 5/1994 | Yamazaki et al. |
| 5,313,075 A | 5/1994 | Zhang et al. |
| 5,352,291 A | 10/1994 | Zhang et al. |
| 5,354,697 A | 10/1994 | Oostra et al. |
| 5,358,907 A | 10/1994 | Wong |
| 5,366,926 A | 11/1994 | Mei et al. |
| 5,387,530 A | 2/1995 | Doyle |
| 5,403,772 A | 4/1995 | Zhang et al. |
| 5,424,230 A | 6/1995 | Wakai |
| 5,426,064 A | 6/1995 | Zhang et al. |
| 5,470,763 A | 11/1995 | Hamada |
| 5,480,811 A | 1/1996 | Chiang et al. |
| 5,481,121 A | 1/1996 | Zhang et al. |
| 5,488,000 A | 1/1996 | Zhang et al. ............... 438/166 |
| 5,492,843 A | 2/1996 | Adachi et al. |
| 5,501,989 A | 3/1996 | Takayama et al. |
| 5,504,019 A | 4/1996 | Miyasaka et al. |
| 5,508,207 A | 4/1996 | Horai et al. |
| 5,508,533 A | 4/1996 | Takemura |
| 5,529,937 A | 6/1996 | Zhang et al. |
| 5,530,266 A | 6/1996 | Yonehara et al. |
| 5,531,182 A | 7/1996 | Yonehara |
| 5,534,716 A | 7/1996 | Takemura |
| 5,543,352 A | 8/1996 | Ohtani et al. |
| 5,543,636 A | 8/1996 | Yamazaki |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,580,815 A | 12/1996 | Hsu et al. |
| 5,585,291 A | 12/1996 | Ohtani et al. |
| 5,589,694 A | 12/1996 | Takayama et al. |
| 5,591,988 A | 1/1997 | Arai et al. |
| 5,595,923 A | 1/1997 | Zhang et al. |
| 5,595,944 A | 1/1997 | Zhang et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,661,311 A * | 8/1997 | Takemura et al. ............. 257/51 |
| 5,663,077 A | 9/1997 | Adachi et al. |
| 5,677,549 A | 10/1997 | Takayama et al. |
| 5,684,317 A | 11/1997 | Hwang |
| 5,684,365 A | 11/1997 | Tang et al. |
| 5,686,328 A | 11/1997 | Zhang et al. |
| 5,693,541 A | 12/1997 | Yamazaki et al. |
| 5,693,959 A | 12/1997 | Inoue et al. |
| 5,696,003 A | 12/1997 | Makiata et al. ............. 438/166 |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,717,224 A | 2/1998 | Zhang |
| 5,728,259 A | 3/1998 | Suzawa et al. |
| 5,734,179 A | 3/1998 | Chang et al. |
| 5,744,822 A | 4/1998 | Takayama et al. ............. 257/66 |
| 5,744,824 A | 4/1998 | Kousai et al. ................. 257/74 |
| 5,756,364 A | 5/1998 | Tanaka et al. |
| 5,763,899 A | 6/1998 | Yamazaki et al. |
| 5,766,977 A | 6/1998 | Yamazaki .................... 438/151 |
| 5,773,327 A | 6/1998 | Yamazaki et al. ........... 438/154 |
| 5,773,846 A | 6/1998 | Zhang et al. .................. 257/66 |
| 5,773,847 A | 6/1998 | Hayakawa .................... 257/66 |
| 5,782,665 A | 7/1998 | Weisfield et al. |
| 5,786,796 A | 7/1998 | Takayama et al. |
| 5,795,795 A | 8/1998 | Kousai et al. ............... 437/174 |
| 5,808,321 A | 9/1998 | Mitanaga et al. ............. 257/72 |
| 5,811,327 A | 9/1998 | Funai et al. ................. 438/166 |
| 5,818,076 A | 10/1998 | Zhang et al. |
| 5,821,138 A | 10/1998 | Yamazaki et al. ........... 438/166 |
| 5,821,560 A | 10/1998 | Arai et al. |
| 5,824,574 A | 10/1998 | Yamazaki et al. ........... 438/150 |
| 5,828,429 A | 10/1998 | Takemura |
| 5,838,508 A | 11/1998 | Sugawara |
| 5,843,225 A | 12/1998 | Takayama et al. |
| 5,846,857 A | 12/1998 | Ju |
| 5,849,611 A | 12/1998 | Yamazaki et al. |
| 5,882,960 A | 3/1999 | Zhang et al. |
| 5,888,858 A | 3/1999 | Yamazaki et al. |
| 5,895,933 A | 4/1999 | Zhang et al. |
| 5,899,547 A | 5/1999 | Yamazaki et al. |
| 5,922,125 A * | 7/1999 | Zhang ......................... 257/72 |
| 5,929,464 A | 7/1999 | Yamazaki et al. |
| 5,929,527 A | 7/1999 | Yamazaki et al. |
| 5,933,205 A | 8/1999 | Yamazaki et al. |
| 5,940,732 A | 8/1999 | Zhang |
| 5,949,107 A | 9/1999 | Zhang |
| 5,953,597 A | 9/1999 | Kusumoto et al. |

| | | |
|---|---|---|
| 5,962,869 A | 10/1999 | Yamazaki et al. |
| 5,963,278 A | 10/1999 | Yamazaki et al. |
| 5,985,740 A | 11/1999 | Yamazaki et al. |
| 5,990,491 A | 11/1999 | Zhang |
| 5,990,542 A | 11/1999 | Yamazaki |
| 6,005,648 A | 12/1999 | Zhang et al. |
| 6,011,275 A | 1/2000 | Ohtani et al. |
| 6,011,277 A | 1/2000 | Yamazaki |
| 6,013,929 A | 1/2000 | Ohtani |
| 6,031,249 A | 2/2000 | Yamazaki et al. |
| 6,048,758 A | 4/2000 | Yamazaki et al. |
| 6,063,654 A | 5/2000 | Ohtani |
| 6,077,731 A | 6/2000 | Yamazaki et al. |
| 6,083,801 A * | 7/2000 | Ohtani ........................ 438/308 |
| 6,093,934 A | 7/2000 | Yamazaki et al. |
| 6,100,562 A | 8/2000 | Yamazaki et al. |
| 6,121,683 A | 9/2000 | Yamazaki et al. |
| 6,140,165 A | 10/2000 | Zhang et al. |
| 6,147,667 A * | 10/2000 | Yamazaki et al. ............ 257/57 |
| 6,175,348 B1 | 1/2001 | Zhang et al. |
| 6,180,439 B1 | 1/2001 | Yamazaki et al. |
| 6,207,969 B1 | 3/2001 | Yamazaki |
| 6,278,132 B1 | 8/2001 | Yamazaki et al. |
| 6,331,718 B1 | 12/2001 | Yamazaki et al. |

FOREIGN PATENT DOCUMENTS

| | | |
|---|---|---|
| JP | 62-169356 | 7/1987 |
| JP | 1-187814 | 2/1989 |
| JP | 64-081324 | 3/1989 |
| JP | 1-187874 | 7/1989 |
| JP | 1-187875 | 7/1989 |
| JP | 1-206632 | 8/1989 |
| JP | 2-148687 | 6/1990 |
| JP | 2-275641 | 9/1990 |
| JP | 3-280418 | 11/1991 |
| JP | 3-280420 | 12/1991 |
| JP | 05-082442 | 4/1993 |
| JP | 05-107561 | 4/1993 |
| JP | 52-99348 | 11/1993 |
| JP | 6-232059 | 8/1994 |
| JP | 2-140915 | 5/1995 |
| JP | 07-161634 | 6/1995 |
| JP | 07-321339 | 12/1995 |
| JP | 7-335900 | 12/1995 |
| JP | 08-129358 | 5/1996 |
| JP | 08-129359 | 5/1996 |
| JP | 08-129360 | 5/1996 |
| JP | 08-234683 | 9/1996 |
| JP | 08-241047 | 9/1996 |
| JP | 08-241048 | 9/1996 |
| JP | 08-241057 | 9/1996 |
| JP | 8-241997 | 9/1996 |

OTHER PUBLICATIONS

S. Caune, et al., "Combined CW Laser and Furnace Annealing of Amorphous Si and Ge in Contact With Some Metals," Applied Surface Science, vol. 36, Jan., 1, 1989, pp. 597–604.

J. Stoemnos et al., "Crystallization of Amorphous Silicon By Reconstructive Transformation Utilizing Gold", Appl. Phys. Lett., 58(11); Mar. 18, 1991; pp. 1196–1198.

R. Kakkad et al., "Crystallized Si Films By Low–Temperature Rapid Thermal Annealing of Amorphous Silicon", J. Appl. Phys., 65(5), Mar. 1, 1989, pp. 2069–2072.

F. Oki et al., "Effect of Deposited Metals On The Crystallization Temperature of Amorphous Germanium Film", Jpn. J. Appl. Phys., 8 (1969) 1056.

A. Y. Kuznetsov et al., "Enhanced Solid Phase Epitaxial Recrystallization of Amorphous Silicon Due to Nickel Silicide Precipitation Resulting From Ion Implantation and Annealing", Nucl. Instruments Methods Physics Research, 880/81 (1993), pp. 990–993.

Hayashi et al., "Fabrication of Low–Temperature Bottom Gate Poly–Si TFTs on Large Area Substrate By LinearBeam Excimer Laser Crystallization and Ion Doping Method, "IEEE IEDM, Jan. 1, 1995, pp. 829–832.

S. Takenaka et al., "High Mobility Poly–Si Thin Film Transistors Using Solid Phase Crystallize a–Si Films Deposited By Plasma Enhanced Chemical Vapor Deposition" Jp. J. Appl. Phys. vol. 219, No. 12, Dec. 1990; pp. L2380–L2383.

Hatalis et al., "High Performance Thin–Film Transistors in Low Temperature Crystallized LPCVD Amorphous Silicon Films", Elec. Dev. Letters vol. EDL 8, No. 8, Aug., 1987, pp. 361–364.

P. Zorabedian et al., "Lateral Seeding of Silicon–on–Insulator Using an Ellipitical Laser Beam: A Comparison of Scanning Methods", Mat. Res. Soc. Symp. Proc. vol. 33 (1984), pp. 81–86.

R. Kakkad et al., "Low Temperature Selective Crystallization of Amorphous Silicon", Journal of Non–Crystalline Solids, 115 (1989), pp. 66–68.

F. Spaepen et al., "Metal–Enchanced Growth of Silicon ", Crucial Issues in Semiconductor Materials & Processing Technologies, (1992) 483–99.

J. M. Green et al., "Method To Purify Semiconductor Wafers" IBM Tech. Discl. Bulletin, vol. 16, No. 5, Oct. 1973, pp. 1612–1613.

T. Hempel et al., "Needle–Like Crystallization of Ni Doped Amorphous Silicon Thin Films", Solid State Communications, vol. 85, No. 11, (1993) pp. 921–924.

I.W. Boyd et al., "Oxidation of Silicon Surfaces by $CO_2$ Lasers", Applied Physics Letters, vol. 41, No. 2, Jul. 15, 1982, pp. 162–164.

G. Liu et al., "Polycrystalline Silicon Thin Film Transistors On Corning 7059 Glass Substrates Using Short Time, Low-temperature Processing," Appl. Phys. Lett. 62(20), May 17, 1993, pp. 2554–2556.

G. Liu et al., "Selective Area Crystallization of Amorphous Silicon Films By Low–Temperature Rapid Thermal Annealing", Appl. Phys. Lett 55(7), Aug. 14, 1989, pp. 660–662.

R. C. Cammarata et al., "Silicide Precipitation and Silicon Crystallization in Nickel Implanted Amorphous Silicon Thin Films", J. Mater. Res. vol. 5, No. 10, 1990; pp. 2133–2138.

C. Hayzelden et al., "Silicide Formation and Silicide Mediated Crystallization of Nickel—Implanted Amorphous Slicon Thin Films"J. Appl. Phys., 73 (12) May 15, 1993; pp. 8279–8289.

A. Y. Kuznetsov et al., "Silicide Precipitate Formation and Solid Phase Re–Growth of Ni—Implanted Amorphous Silicon" Inst. Phys. Conf. Ser. No. 134.4; Proceedings of Royal Microscopical Society Conf.; Apr. 5–8, 1993, pp. 191–194.

Wolf et al., "Silicon Processing for the VLSI Era vol. 1: Process Technology", Lattice Press 1986, pp. 215–216.

S. Lau et al., "Solid Phase Epitaxy in Silicide Forming System", Thin Solid Films, 47 (1977) pp. 313–322.

Kawazu et al., "Low—Temperature Crystallization of Hydrogenated Amorphous Silicon Induced by Nickel Silicide Formation", Inst. of App. Phys., vol. 29, No. 12, Dec. 1990, pp. 2698–2704.

S. Wolf, et al., "Silicon Processing For The VLSi Era vol. 1—Process Technology", Lattice Press, 1986, pp. 550–551.

J. Bruines, et al., Between Explosive Crystallization and Amorphous Regrowth: Inhomogeneous Solidification upon Pulsed Laser Annealing of Amorphous Silicon, Applied Physics Letter, vol. 50, Mar. 1, 1987, pp. 507–509.

Y. Kawazu, et al., "Initial Stage of the Interfacial Reaction between Nickel and Hydrogenated Amorphous Silicon", Japanese Journal of App. Phys., vol. 29, Apr. 1, 1990, pp. 729–738.

S. Wolf, Et al., "Silicon Processing for the VLSI Era Vol. 1: Process Technology", Lattice Press 1986, vol. 1, Jan. 1, 1986, pp. 207–211.

J. Batstone et al., "Microscopic Processes in Crystallisation", Solid State Phenomena, vol. 37–38, Jan. 1, 1994, pp. 257–268.

T. Suresh, et al., "Electroless Plated Nickel Contacts to Hydrogenated Amorphus Silicon", Thin Solid Films, vol. 252, Jan. 1, 1994, pp. 78–81.

K. Sakaguchi et al., "Current Progress in Epitaxial Layer Transfer", IEICE Trans. Electron, vol E80 C/No. 3, Mar. 1, 1997, pp. 378–387.

Y. Kuo, Thin Film Trans. Tech., vol. 94–35, pp. 116–122. (cited by Examiner in 08/784,292, without providing a copy).

D. Kouvatsos, et al., "Fluorine–enchanced Oxidation of Polycrystalline Silicon and Application to Thin–film Transistor Fabrication", Appl. Phys. Letter vol. 61, No. 8, Aug. 24, 1992, pp. 937–939.

S. Sze, "VLSI Technology", McGraw–Hill Publishing Company, Second Edition, pp. 397–400, Jan. 1, 1988.

Y. Erokin, et al., Spatially Confined Nickel Disilicide Formation at 400c on Ion Implantation Preamorphized Silicon; Appl. Phys. Letter, vol. 63, Dec. 6, 1993, pp. 3173–3175.

A. Dvurechenskii, et al., "Transport Phenomena in Amorphous Silicon Doped by Ion Implantation of 3d Metals", Phys. Stat. Sol., Jan. 1, 1986, pp. 635–640.

S. Ghandhi, "VLSI Fabrication Principles", Wiley and Sons, Jan. 1, 1983, pp. 419–429.

F. Kuper, et al., "Effects of Fluorine Implantation on the Kenetics of Dry Oxidation of Silicon", J. Applied Plysicis, Aug. 1, 1986, pp. 985–990.

S. Wolf, et al., "Silicon Processing for the VlSI Era vol. 1: Process Technology", Lattice Press 1986, Jan. 1, 1986, vol. 1, pp. 198–207.

M. Thompson et al.; Silicide formation in Pd–a–Si:H Shottky barriers: Appl. Phys. Letters; vol. 39, No. 3 pp. 274–276, Aug. 1, 1981.

R. Nemanich et al.; Initial Phase Formation at the Interface of Ni, Pd or Pt and Si; Mat. Res. Soc. Symp. Proc., vol. 25, Jan. 1, 1984.

R. Nemanich et al.; Structure and Growth of the Interface of Pd on a–Si:H; Physical Review B, vol. 23, No. 12, pp. 6828–6831. Jun. 15, 1981.

* cited by examiner

SEMICONDUCTOR DEVICE AND ITS MANUFACTURING METHOD

This application is a Divisional of application Ser. No. 08/785,536, filed Jan. 17, 1997 U.S. Pat. No. 6,093,934.

BACKGROUND OF THE INVENTIONS

1. Field of the Invention

The present invention relates to a crystalline thin-film semiconductor and a manufacturing method thereof. The invention also relates to a semiconductor device using the above thin-film semiconductor and a manufacturing method thereof.

2. Description of Related Art

Techniques are known in which a crystalline silicon film is formed on a glass or quartz substrate and thin-film transistors (hereinafter referred to as TFTs) are formed by using the silicon film. Such TFTs are called high-temperature polysilicon TFTs or low-temperature polysilicon TFTs.

In the case of high-temperature polysilicon TFTs, a crystalline silicon film is formed by a technique including a heat treatment at a relatively high temperature of 800–900° C. It can be said that this technique is derived from an IC manufacturing process using a single crystal silicon wafer. Naturally, high-temperature polysilicon TFTs are formed on a quartz substrate, which withstand the above-mentioned high temperature.

On the other hand, low-temperature polysilicon TFTs are formed on a glass substrate, which is inexpensive but is apparently lower in heat resistance than a quartz substrate. To form a crystalline silicon film for low-temperature polysilicon TFTs, heating at lower than 600° C. which a glass substrate can withstand or laser annealing which causes almost no thermal damage on a glass substrate is performed.

The high-temperature polysilicon TFT is advantageous in that TFTs having uniform characteristics can be integrated on a substrate.

On the other hand, the low-temperature polysilicon TFT is advantageous in that a glass substrate can be used which is inexpensive and can easily be increased in size.

According to the current manufacturing techniques, there are no large differences in characteristics between the high-temperat ure polysilicon TFT and the low-temperature polysilicon TFT. That is, in both cases, the mobility is 50–100 cm$^2$/Vs and the S value is 200–400 mV/dec. ($V_D$=1 V).

However, these values are much worse than those of MOS transistors formed on a single crystal silicon wafer. In general, the S value of MOS transistors formed on a single crystal silicon wafer is 60–70 mV/dec.

At present, there are active matrix liquid crystal display devices in which an active matrix circuit and peripheral driver circuits are integrated on the same substrate by using TFTs. In this type of configuration, the source driver circuit of the peripheral driver circuits is required to operate at a frequency higher than a little more than 10 MHz. However, at present, a circuit using high-temperature polysilicon TFTs or low-temperature polysilicon TFTs can provide a margin of operation speed that is as small as several megahertz.

For this reason, at present, a liquid crystal display device is constituted by dividing its operation (called "divisional driving"). However, this method has several problems; for example, stripes appear on the screen due to, for instance, a slight deviation in the division timing.

SUMMARY OF THE INVENTION

It is now considered a configuration in which not only peripheral driver circuits (constituted of a shift register circuit and a buffer circuit) but also an oscillation circuit, a D/A converter, an AD converter, and digital circuits for various kinds of image processing are integrated on the same substrate.

However, the above-mentioned oscillation circuit, D/A converter, A/D converter, and digital circuits for various kinds of image processing are required to operate even at higher frequencies than the peripheral driver circuits. Therefore, it is very difficult to constitute such circuits by using high-temperature polysilicon TFTs or low-temperature polysilicon TFTs as long as they are formed by the current manufacturing techniques.

On the other hand, integrated circuits of MOS transistors formed on a single crystal silicon wafer which circuits can operate at more than 100 MHz have already been put to practical use.

An object of the present invention is to provide a TFT which can constitute a circuit that is required to perform a high-speed operation (generally at more than tens of megahertz).

Another object of the invention is to provide a TFT whose characteristics are equivalent to those of a MOS transistor formed on a single crystal silicon wafer. It is also intended to provide a means for manufacturing such a TFT. It is further intended to provide a semiconductor device having a required function by using TFTs having so superior characteristics.

According to one aspect of the invention, there is provided a semiconductor device using a thin-film transistor that uses, as an active layer, a crystalline silicon film formed on a substrate having an insulating surface, wherein the crystalline silicon film has a crystal structure that is continuous in a predetermined direction, and grain boundaries extending in the predetermined direction; the predetermined direction is at a predetermined angle with a direction connecting a source region and a drain region of the thin-film transistor; and an impurity is segregated in the grain boundaries.

FIGS. 6 and 7 show an example of a crystalline silicon film having the above-mentioned crystal structure. FIGS. 6 and 7 are photographs of obtained by observing the surface of a 250-Å-thick crystalline silicon film with a transmission electron microscope (TEM). FIG. 7 is an enlargement of part of the photograph of FIG. 6.

The crystalline silicon film of FIGS. 6 and 7 can be obtained by a manufacturing process of a first embodiment of the invention which will be described later.

FIGS. 6 and 7 show a crystal structure that continuously extends from the bottom left to the top right in these drawings, as well as many grain boundaries extending substantially parallel with the above direction.

As is apparent from the crystal structure shown in FIG. 7, this crystalline silicon film is a collection of many crystallizations (crystalline silicon grains) each having a crystal structure extending in the particular direction. The width of the crystallizations is 500–2,000 Å, or from about the thickness of the crystalline silicon film to 2,000 Å.

Many definite grain boundaries are arranged, at intervals, perpendicularly or substantially perpendicularly (in the direction from the bottom right to the top left in these drawings) to the direction in which the crystal structure has continuity: the crystal structure is discontinuous (continuity is lost) in the former direction.

The continuity of the lattice structure is substantially maintained in the direction in which the crystal structure has continuity. In this direction, the scattering and trapping of carriers during their movement occur at a much smaller possibility than in the other directions.

That is, it can be considered that a substantial single crystal state, in which carriers are not scattered or are hardly scattered by grain boundaries, is established in the direction in which the crystal structure has continuity.

Further, oxygen or halogen elements are confirmed being in segregated state in the grain boundaries. This is confirmed by analyzing X-ray spectra generated as irradiating with a converged electron beam. It is considered that the oxygen and halogen elements are segregated in the grain boundaries at the time of forming a thermal oxide film after crystallization.

The above-mentioned aspect of the invention defines the relationship between the direction in which the crystal structure has continuity and the direction connecting the source and drain regions of a thin-film transistor. To attain a high-speed operation, it is desired that the direction in which the crystal structure has continuity coincide or substantially coincide with the direction connecting the source and drain regions. This provides a configuration in which carriers can move most easily.

The characteristics of a thin-film transistor can be controlled by setting the angle between the above two directions at a proper value. For example, in the case of forming a number of thin-film transistor groups, the characteristics of a plurality of groups can be made different from each other by changing the angle between the two directions from one group to another.

A thin-film transistor in which the active layer is bent to assume an N-like or a square-bracket-like, or even an M-like shape, that is, the line connecting the source and drain regions is bent can be formed in the following manner. That is. the direction in which the crystal structure has continuity is so set as to coincide with the carrier moving direction (as a whole) in the channel region.

Also in this case, the fastest operation can be expected when the angle between the carrier moving direction and the direction in which the crystal structure has continuity is set at 0°. It is apparent that this angle may be set at a proper value other than 0°, when necessary.

According to another aspect of the invention, there is provided a semiconductor device using a thin-film transistor that uses, as an active layer, a crystalline silicon film formed on a substrate having an insulating surface, wherein the crystalline silicon film is anisotropic in a grain boundary extending direction; the predetermined direction is at a predetermined angle with a direction connecting a source region and a drain region of the thin-film transistor; and an impurity is segregated in the grain boundary.

According to still another aspect of the invention, there is provided a semiconductor device using a thin-film transistor that uses, as an active layer, a crystalline silicon film formed on a substrate having an insulating surface, wherein the crystalline silicon film is anisotropic in a grain boundary extending direction; the grain boundary extending direction and a carrier moving direction in a channel region of the thin-film transistor form a given angle; and an impurity is segregated in the grain boundary.

To obtain the crystalline silicon film of the invention, it is necessary to perform a heat treatment after introducing a metal element that accelerates crystallization of silicon as typified by nickel into an amorphous silicon film, and further perform a heat treatment in an atmosphere containing a halogen element. The heat treatment to form a thermal oxide film causes oxygen and halogen elements in the atmosphere to deposit into the grain boundary.

As the metal element, nickel is the best in terms of reproducibility and effects. In general, the metal element may be one or a plurality of elements selected from the group consisting of Fe, Co, Ni, Ru, Rh, Pd, Os, Ir, Pt, Cu, and Au.

Where nickel is used, the concentration of nickel left in a final silicon film is $1 \times 10^{14}$ to $5 \times 10^{18}$ atoms/cm$^3$. If the gettering conditions of a thermal oxidation film are refined, the upper limit of the concentration can be reduced to $5 \times 10^{17}$ atoms/cm$^3$. The concentration can be measured by the SIMS (secondary ion mass spectrometry).

In general, the lower limit of the nickel concentration is $1 \times 10^{16}$ atoms/cm$^3$. This is because when a balance with the cost is considered, it is usually difficult to eliminate the influences of nickel attached to a substrate and an apparatus used.

Therefore, when an ordinary manufacturing process is employed, the concentration of residual nickel is in a range of $1 \times 10^{16}$ to $5'10^{17}$ atoms/cm$^3$.

Since metal element moves into a thermal oxidation film in the step of forming it, metal element has a concentration gradient or distribution in the thickness direction of a resulting crystalline silicon film.

It is generally observed that the concentration of the metal element in the crystalline silicon film increases toward the boundary of the thermal oxidation film. Under certain conditions, it is observed that the concentration of the metal element increases toward a substrate or an undercoat film, i.e., toward the lower-side boundary.

Where a halogen element is contained in an atmosphere used in forming the thermal oxidation film, the halogen element assumes a concentration distribution similar to that of the metal element. That is, the concentration increases toward the upper surface and/or lower surface of the crystalline silicon film.

In the invention, it is preferred that the crystalline silicon film finally has a thickness of 100–750 Å. It is even preferred that the thickness be 150–450 Å. With the thickness in such ranges, the unique crystal structure in which the crystallinity is continuous in one direction as shown in FIGS. 6 and 7 can be obtained with high reproducibility in a more enhanced manner.

It is necessary to determine the thickness of the final crystalline silicon film by considering the fact that the thickness is decreased by the formation of the thermal oxidation film.

According to a further aspect of the invention, there is provided a manufacturing method of a semiconductor device, comprising the steps of forming an amorphous silicon film on a substrate having an insulating substrate; selectively introducing a metal element for accelerating crystallization of silicon into a portion of the amorphous silicon film; performing a heat treatment, to thereby effect crystal growth parallel with the substrate in a direction from the portion in which the metal element has been introduced to the other portions; performing a heat treatment at 800–1, 100° C. for 30 minutes or more by an electrical furnace in an oxidizing atmosphere containing a halogen element, to form a thermal oxidation film; removing the thermal oxidation film; arranging a direction connecting a source region and a drain region with a crystal growth direction substantially. and segregating an impurity along the crystal growth direction.

The crystalline silicon film of the invention can be obtained by the above manufacturing process. Further, a MOS thin-film transistor utilizing the uniqueness of its crystal structure can be formed.

A metal element can be introduced by various methods, among which are a method of applying a solution containing the metal element, a method using CVD, a method using sputtering or evaporation, a plasma processing method using an electrode that contains the metal element, and a method using gas absorption.

To introduce a halogen element, there may be used a certain means for causing an oxidizing atmosphere (for instance, an oxygen atmosphere) to contain HCl, HF, HBr, $Cl_2$, $F_2$, $Br_2$, $CF_4$, or the like.

It is effective to introduce a hydrogen gas into an atmosphere used in forming a thermal oxidation film, and thereby utilize the action of wet oxidation.

The temperature is a very important factor in forming a thermal oxidation film. To obtain a TFT that can operate in itself at more than several tens of megahertz and has a small S value of less than 100 mV/dec. (described later), it is preferable that the temperature of a heat treatment for forming a thermal oxidation film be more than 800° C. It is even preferable that the temperature be more than 900° C.

The lower limit depends upon a pressure at which the annealing is performed and a vapor pressure of the halogen compound of the material to be gettered. That is, when the vapor pressure of the halogen compound is smaller than the pressure of the annealing atmosphere. the gettering efficiency is not so high. For example, the vapor pressure of nickel chloride is 38.9 mmHg at 541° C. and 820.6 mmHg at 994° C. Accordingly, when the annealing is performed at the atmospheric pressure (760 mmHg), the effect of the gettering is significantly increased when the temperature is 994° C.

It is appropriate that the upper limit of the above temperature be set at about 1,100° C., which is the upper limit a quartz substrate withstands.

According to another aspect of the invention, there is provided a manufacturing method of a semiconductor device, comprising the steps of forming an amorphous silicon film on a substrate having an insulating substrate; selectively introducing a metal element for accelerating crystallization of silicon into a portion of the amorphous silicon film; performing a heat treatment, to thereby effect crystal growth parallel with the substrate in a direction from the portion in which the metal element has been introduced to the other portions; performing a heat treatment at 800–1,100° C. for 30 minutes or more by an electrical furnace in an oxidizing atmosphere containing a halogen element, to form a thermal oxidation film; removing the thermal oxidation film; and arranging a carrier moving direction in a channel region to coincide with or substantially coincide with a crystal growth direction; and segregating an impurity along the crystal growth direction.

The above manufacturing method pays attention to the carrier moving direction in the channel region, and defines the relationship between the carrier moving direction and the crystal growth direction (i.e., the direction in which the crystal structure has continuity or grain boundaries extend).

This manufacturing method is effective even in a case where the line connecting the source and drain regions is bent.

A specific example of the invention will be described below. In the technique of forming a crystalline silicon film by crystallizing an amorphous silicon film by heating it, a heat treatment is performed in a state that nickel is held in contact with a portion of the surface of the amorphous silicon film, so that crystal growth proceeds parallel with a substrate from the above portion to the other portions.

Subsequently, a thermal oxidation film is formed on the surface of a resulting crystalline silicon film by performing a heat treatment at 800–1,100° C. for 30 minutes or more by an electrical furnace in an oxidizing atmosphere containing a halogen element.

The thermal oxidation film is then removed. A crystalline silicon film thus obtained has a structure in which grain boundaries extend in a particular direction as shown in FIGS. 6 and 7 and the crystal structure is continuous in the same direction.

A TFT having superior characteristics can be obtained by making the carrier moving direction during an operation coincide with the direction of the continuous crystal growth.

DETAILED DESCRIPTION OF THE PREFERRED EMBODIMENTS

Embodiment 1

Figure 1A:
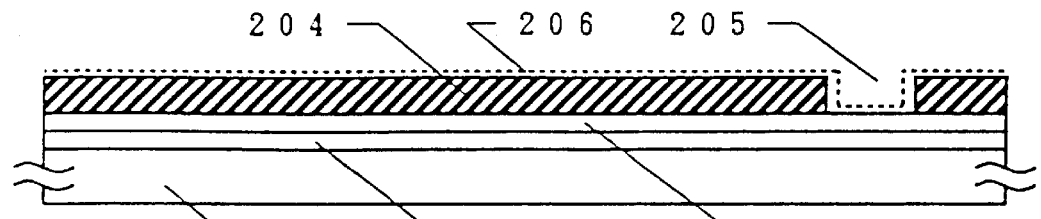
FIGS. 1A–1D and 2A–2E show a manufacturing process of a TFT according to a first embodiment of the present invention.
Figure 1B:
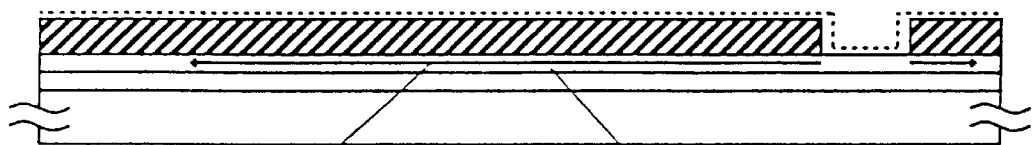

This embodiment is directed to a method of effecting crystal growth parallel with a substrate (called "lateral growth") by selectively introducing into an amorphous silicon film a metal element that accelerates crystallization of silicon.

FIGS. 1A–1D and FIGS. 2A–2E show a manufacturing process according to this embodiment. First, a 3,000-Å-thick silicon oxide film as an undercoat film 202 is formed on a quartz substrate 201. The undercoat film 202 can be omitted if the quartz substrate 201 is sufficiently smooth and if sufficient cleaning is performed.

Although the use of a quartz substrate is preferable at present, the invention is not limited to the use of a quartz substrate and other substrates can also be used as long as they withstand a heat treatment temperature.

Next, a 600-Å-thick amorphous silicon film 203 as a starting film of a crystalline silicon film is formed by low-pressure thermal CVD. It is preferred that the amorphous silicon film 203 be thinner than 2,000 Å.

Thereafter, a 1,500-Å-thick silicon oxide film (not shown) is formed and then patterned into a mask 204 which has an opening 205. The amorphous silicon film 203 is exposed in the opening 205.

The opening 205 has a long and narrow rectangular shape in which the longitudinal direction extends perpendicularly to the paper surface of FIGS. 9A–9D. It is appropriate that the opening 205 be wider than 20 μm and have a necessary length in the longitudinal direction.

After a nickel acetate solution containing nickel (nickel element) at 10 ppm in terms of weight is applied, and excessive part of the applied solution is removed by spin drying with the use of a spinner (not shown).

Thus, there is obtained a state in which nickel exists as indicated by a broken line 206 in FIG. 1A. In this state, nickel is so held as to be brought in contact with part of the amorphous silicon film selectively, i.e., at the bottom of the opening 205.

Figure 9A:
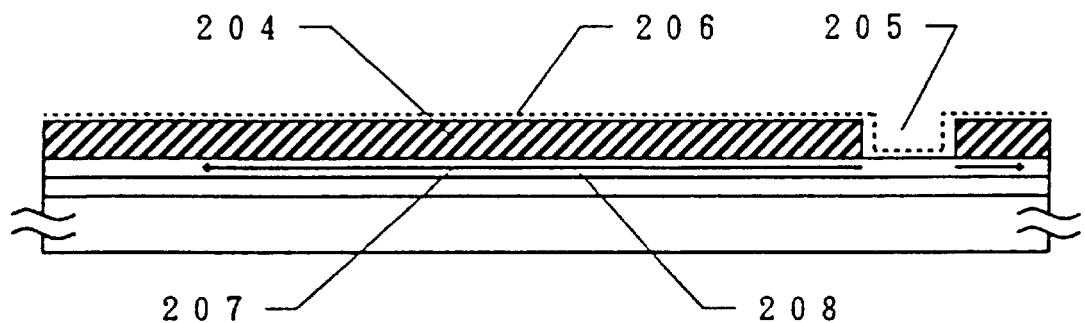
FIGS. 9A and 9B schematically illustrate how crystal growth proceeds.
Figure 9B:
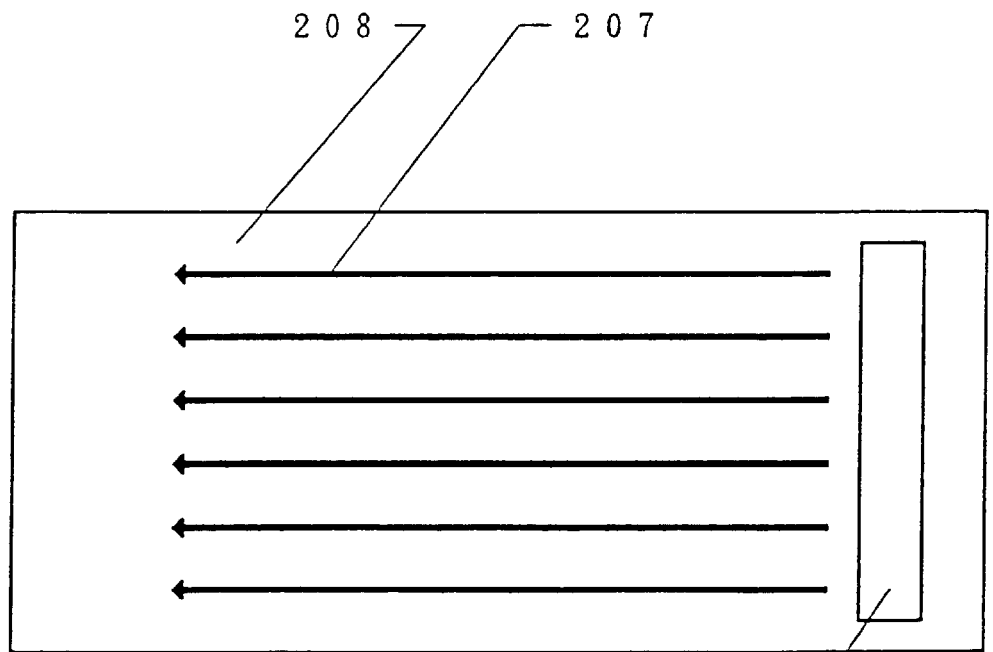

A heat treatment is performed in this state at 640° C. for 4 hours in a nitrogen atmosphere in which hydrogen is contained at 3% but the content of oxygen is minimized. As a result, crystal growth proceeds parallel with the substrate 201 as indicated by arrow 207 in FIG. 1B. FIG. 9B is a top view schematically showing how the crystal growth proceeds.

This crystal growth proceeds around from the opening 205 from which nickel has been introduced. This type of crystal growth that is parallel with the substrate is called lateral growth.

A crystalline silicon film obtained by the lateral growth has a much smoother surface than a conventional high-temperature or low-temperature polysilicon film. This is considered due to the fact that in the former case grain boundaries extend approximately in the same direction.

General polysilicon films have surface asperities of more than ±100 Å. In contrast, it was observed that silicon films obtained by lateral growth according to this embodiment have asperities that are as small as ±30 Å. Since the asperities deteriorate the characteristics of a boundary with a gate insulating film, they should be as small as possible.

Under the above-mentioned heat treatment conditions for the crystallization, the lateral growth can proceed over more than 100 μm. Thus, a silicon film 208 having a lateral growth region is formed.

The heat treatment for the above crystal growth may be performed at 450–1,100° C., the upper limit being restricted by the heat resistance of the substrate. To obtain a certain lateral growth length, it is preferred that the heat treatment be performed at more than 600° C. Even if the temperature is set higher than 600° C., no remarkable improvement is obtained in crystal growth length or crystallinity.

Figure 1C:
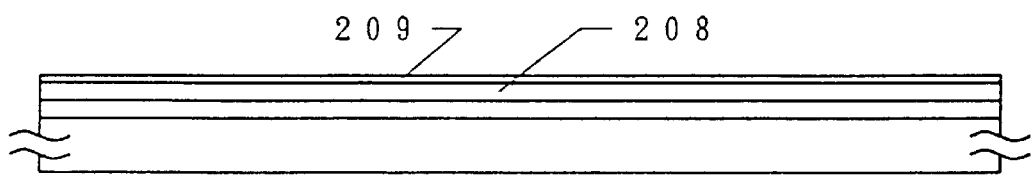
Figure 1D:
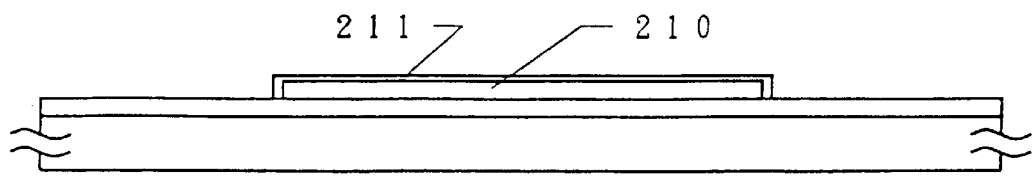

The silicon oxide mask 204 that was used to selectively introduce nickel is now removed. Thus, the state of FIG. 1C is obtained.

In this state, nickel does not exist uniformly. In particular, nickel exists at relatively high concentrations in the opening 205 and the leading portion of the crystal growth indicated by arrows 207. Therefore, in forming an active layer, it is important to avoid such regions. That is, it is important that an active layer not include a region where nickel obviously has a higher concentration than in the other regions.

Figure 2A:
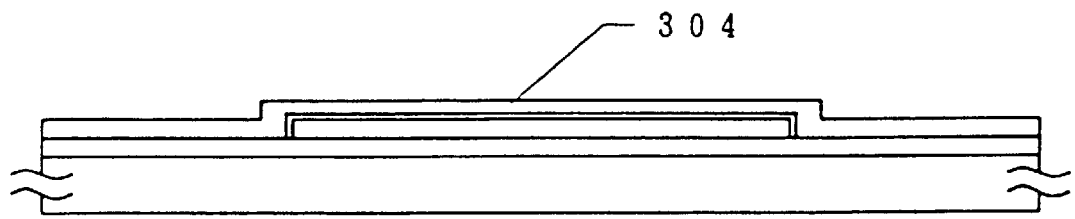
Figure 2B:
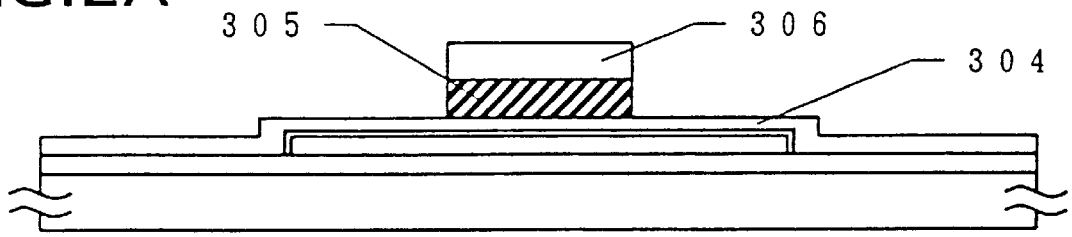
Figure 2C:
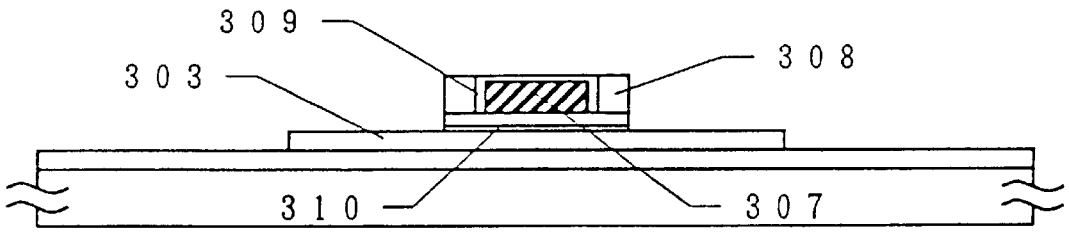

To improve the crystallinity, laser light irradiation may be performed in the state of FIG. 2C. The laser light irradiation has an effect of disperse a cluster of nickel in the film 208, to thereby facilitate later removal of nickel. The laser light irradiation at this stage does not cause any further lateral growth.

The laser light may be excimer laser light having a wavelength in the ultraviolet range. For example, a KrF excimer laser (wavelength: 248 nm) or a XeCl excimer laser (wavelength: 308 nm) may be used.

Next, a heat treatment is performed at 950° C. for 30 minutes or more by an electrical furnace in an oxygen atmosphere containing HCl at 3 volume %, to form a 200-Å-thick thermal oxidation film 209. As a result of the formation of the thermal oxidation film 209, the thickness of the silicon film 208 is reduced by about 100 Å to about 500 Å.

In the above step, silicon elements in an unstable bonding state in the film 208 are used to form the thermal oxidation film 209, so that defects in the film 208 are reduced in number and hence a higher degree of crystallinity is obtained.

At the same time, due to the formation of the thermal oxidation film 209 and the action of chlorine, nickel elements are gettered from the film 208.

Naturally nickel is introduced into the thermal oxidation film 209 at a comparatively high concentration, and the nickel concentration of the silicon film 208 becomes relatively small.

Figure 6:
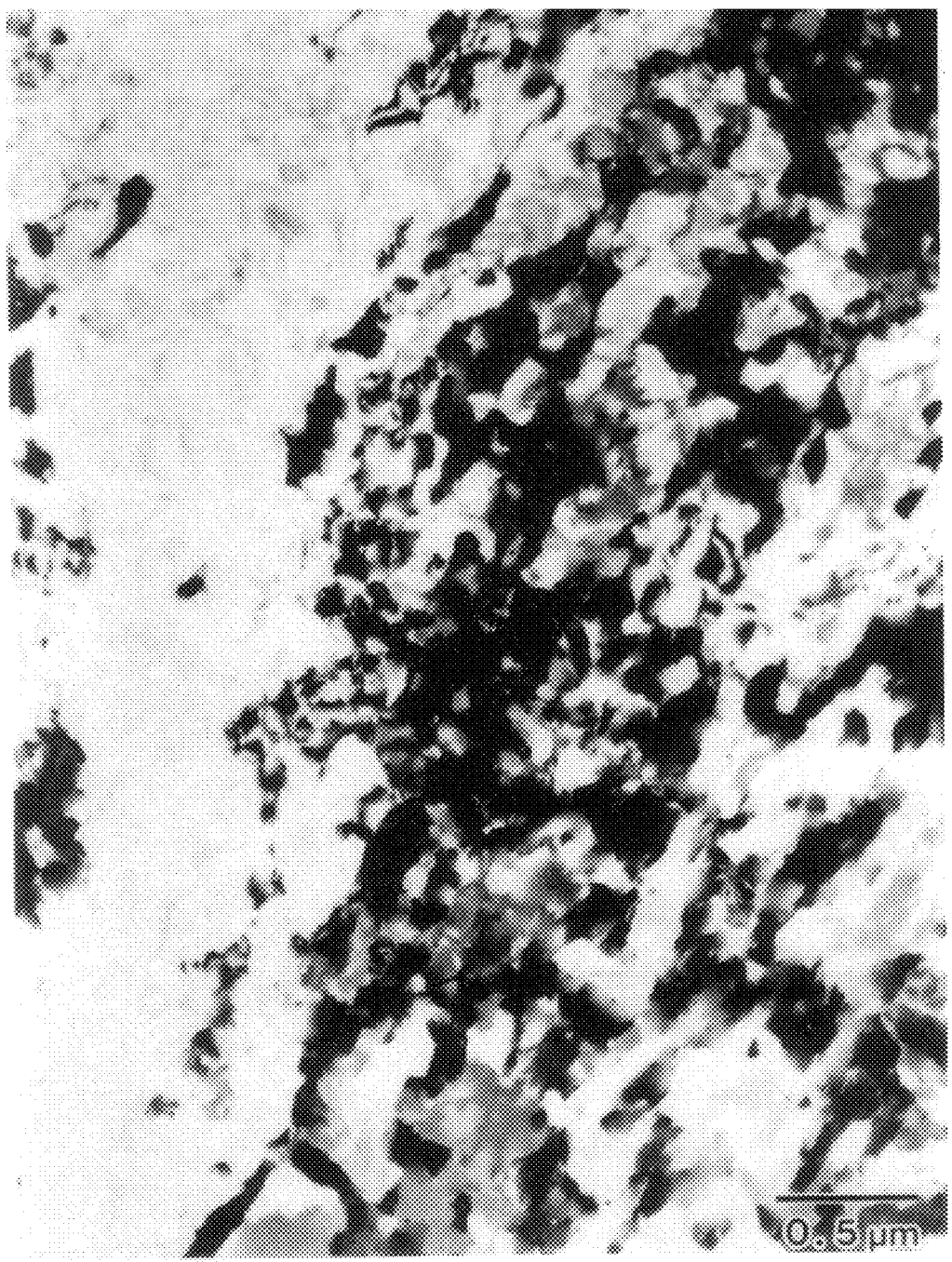
FIGS. 6 and 7 are electron microscope photographs of a silicon thin film.
Figure 7:

The thermal oxidation film 209 is then removed. Thus, the crystalline silicon film 208 with a decreased nickel content remains. As shown in FIGS. 6 and 7, the crystalline silicon film thus obtained has a crystal structure extending in one direction (i.e., in the crystal growth direction). That is, a number of long and thin cylindrical crystallizations extend parallel with each other in one direction with grain boundaries separating the crystallizations. Oxygen and chlorine are segregated in the crystal boundaries which extends in one direction (i.e., in the crystal growth direction).

The crystal boundaries in which the impurities are segregated perform energy barriers. The energy barriers have a function of limiting carriers to move along the crystal growth direction.

Subsequently, the crystalline silicon film 208 is patterned into a pattern 210 of a lateral growth region. This island-like region 210 will become a TFT active layer.

The patterning is performed with an orientation that makes the direction connecting a source region and a drain region at least substantially coincide with the crystal growth direction. With this orientation, the carrier movement direction is made equal to the direction in which crystal lattices extend continuously, to enable provision of a TFT having superior characteristics.

Thereafter, a 300-Å-thick thermal oxidation film 211 is formed on the pattern 210 by a heat treatment of 950° C. for 30 minutes or more by an electrical furnace in an oxygen atmosphere containing HCl at 3%. In this state, the pattern (to become the active layer) 210 has a total thickness of 350 Å (including the thickness of the thermal oxidation film 211). A sum of thicknesses of the thermal oxide films formed is thicker than the final thickness of the crystalline silicon film.

In the step of forming the thermal oxidation film 211, the same effects as in forming the thermal oxidation film 209 can be obtained. The thermal oxidation film 211 will become part of a gate insulating film of the TFT.

Next, a 1,000-Å-thick silicon oxide film 304 to constitute the gate insulating film together with the thermal oxidation film 211 is formed by plasma CVD. (FIG. 2A)

A 4,000-Å-thick aluminum film to constitute a gate electrode is then formed by sputtering. Scandium is included in the aluminum film at 0.2 wt % to suppress occurrence of hillocks and whiskers in a later step. Hillocks and whiskers are needle or prickle-like protrusions as formed by abnormal growth of aluminum.

After the formation of the aluminum film, a dense anodic oxide film (not shown) is formed in the following manner. The electrolyte is an ethylene glycol solution containing tartaric acid at 3%. The aluminum film is used as the anode while platinum is used as the cathode. In this step, a 100-Å-thick, dense anodic oxide film is formed on the aluminum film.

The anodic oxide film (not shown) has a role of improving the adhesion of a resist mask that will be formed later. The thickness of the anodic oxide film can be controlled by the application voltage during the anodization.

After a resist mask 306 is formed, the aluminum film is patterned into a pattern 305. Thus, the state of FIG. 2B is obtained.

Anodization is again performed in this state in an electrolyte which is a 3% aqueous solution of oxalic acid. The aluminum pattern 305 is used as the anode. As a result, a porous anodic oxide film 308 is formed. Since the resist mask 306 is in close contact with the top face of the aluminum pattern 305, the anodic oxide film 308 is selectively formed on the side face of the aluminum pattern 305.

The thickness of the anodic oxide film 308 can be increased to several micrometers. In this embodiment, the thickness is set at 6,000 Å. The growth length (i.e., thickness) of the anodic oxide film 308 can be controlled by the anodization time.

After the resist mask 306 is removed, a dense anodic oxide film is again formed. That is, anodization is again performed by using the above-mentioned electrolyte, i.e., an ethylene glycol solution containing tartaric acid at 3%.

In this step, a dense anodic oxide film 309 is formed as shown in FIG. 2C because the electrolyte enters into the porous anodic oxide film 308.

The thickness of the dense anodic oxide film 309 is set at 1,000 Å. The thickness is controlled by the application voltage.

Figure 2D:
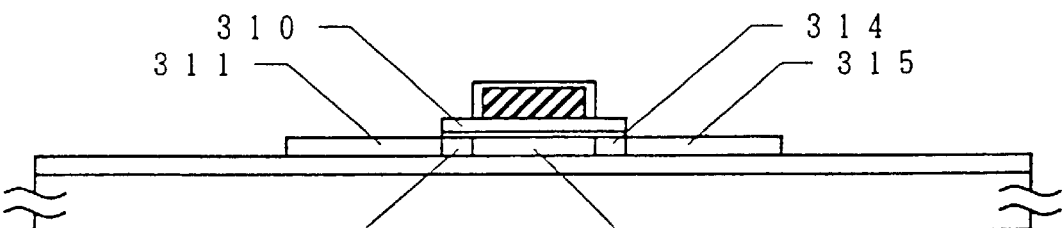
Figure 2E:
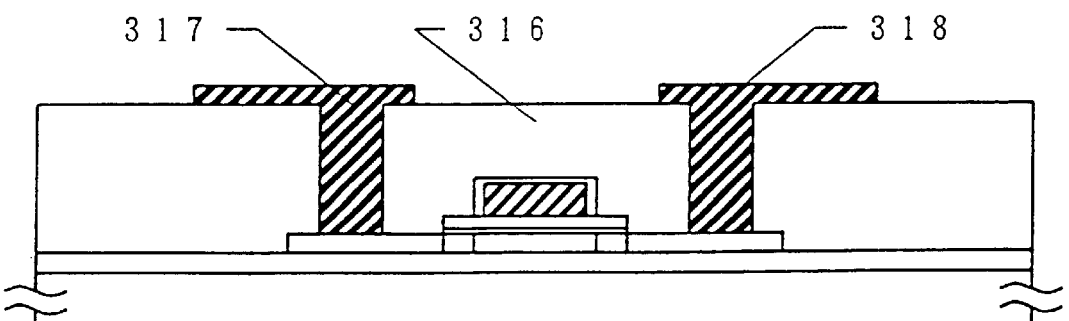

Next, the exposed portions of the silicon oxide film 304 as well as parts of the thermal oxidation film 300 are etched by dry etching. The porous anodic oxide film 308 is then removed by using a mixed acid of acetic acid, nitric acid, and phosphoric acid. Thus, the state of FIG. 2D is obtained.

Impurity ions are implanted in this state. In this embodiment, P (phosphorus) ions are implanted by plasma doping to form an n-channel TFT.

In this step, heavily doped regions 311 and 315 and lightly doped regions 312 and 314 are formed. This is because the residual silicon oxide film 310, which serves as a semi-transparent mask, shields part of ions launched.

The regions doped with impurity ions are then activated by illuminating those with laser light (or strong light emitted from a lamp). In this manner, a source region 311, a channel forming region 313, a drain region 315, and low-concentration impurity regions 312 and 314 are formed in a self-aligned manner. The region 314 is called a LDD (lightly doped drain) region. (FIG. 2D).

If the dense anodic oxide film is made thicker than 2,000 Å, offset gate regions as thick as the dense anodic oxide film can be formed outside the channel forming region 313.

Although offset gate regions are formed even in this embodiment, they have only little contribution because of their small dimension, and they are not shown in the drawings to prevent the drawings from becoming unduly complex.

To make the dense anodic oxide film 309 thicker than 2,000 Å, an application voltage of more than 200 V is needed. In this case, sufficient case should be taken for reproducibility and safety.

Next, a silicon oxide film, a silicon nitride film, or a laminate film thereof is formed as an interlayer insulating film 316. Alternatively, the interlayer insulating film 316 may be composed of a silicon oxide film or a silicon nitride film and a resin film formed thereon.

After contact holes are formed through the interlayer insulating film 316, a source electrode 317 and a drain electrode 318 are formed. Thus, a TFT is completed as shown in FIG. 3E.

The TFT of this embodiment exhibits much superior characteristics that were not obtained conventionally. For example, an NTFT (n-channel TFT) has a mobility of 200–300 cm$^2$/V.s and an S-value of 75–90 mV/dec. ($V_D$=1 V), and a PTFT (p-channel TFT) has a mobility of 120–180 cm$^2$/V.s and an S-value of 75–100 mV/dec. ($V_D$=1 V).

In particular, the S-value is extremely small, that is, less than ½ of the S-values of the conventional high-temperature and low-temperature silicon TFTs.

Embodiment 2

This embodiment is directed to a case where the gate insulating film forming method is modified in the manufacturing method of the first embodiment.

FIGS. 3A–3D show a manufacturing method according to this embodiment. A crystalline silicon film 208 having a lateral growth region is formed by the steps of FIGS. 1A and 1B. The thickness of an amorphous silicon film as a starting film is set at 500 Å.

Figure 3A:
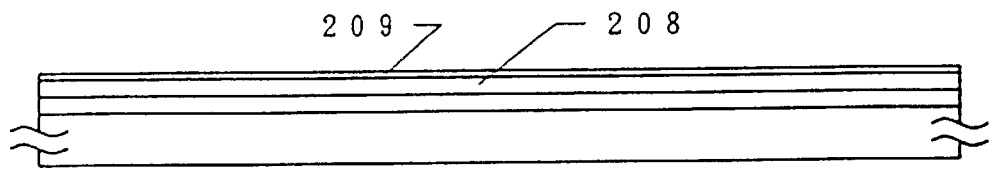
FIGS. 3A–3D show a manufacturing process of a TFT according to a second embodiment of the invention.

Once the crystalline silicon film 208 is formed, a 200-Å-thick thermal oxidation film 209 is formed by performing a heat treatment of 950° C. for 30 minutes or more by an electrical furnace in an oxygen atmosphere containing HCl at 3%. (FIG. 3A).

Figure 3B:
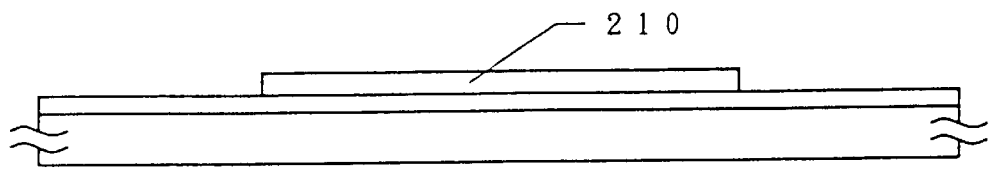

After the thermal oxidation film 209 is removed, the crystalline silicon film 208 is patterned into a pattern 210 which will become a TFT active layer. (FIG. 3B).

Figure 3C:
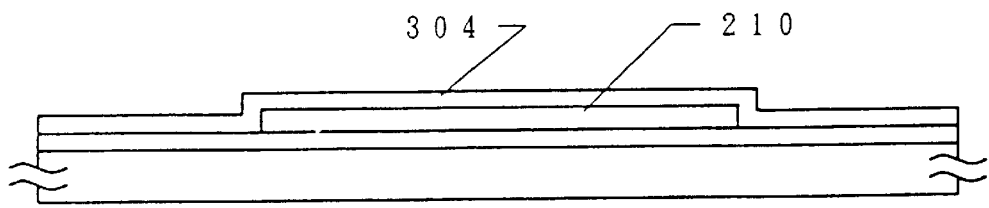

Next, a 1,000-Å-thick gate insulating film 304 is formed by plasma CVD. (FIG. 3C).

A 300-Å-thick thermal oxidation film 211 is then formed by a heat treatment of 950° C. for 30 minutes or more by an electrical furnace in an oxygen atmosphere containing HCl at 3%. (FIG. 3D).

Figure 3D:
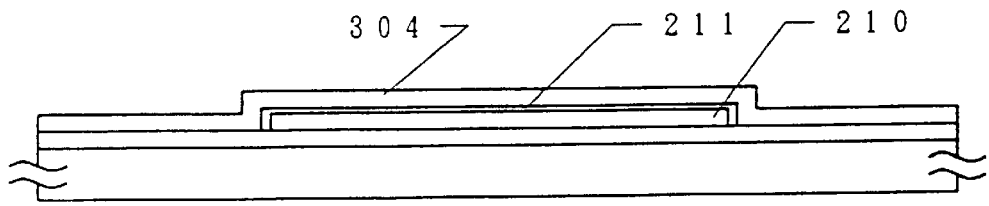

In this step, the thermal oxidation film grows inside the CVD oxide film 304 as shown in FIG. 3D. A sum of thicknesses of the thermal oxide films formed is thicker than the final thickness of the crystalline silicon film.

When the manufacturing process of this embodiment is employed. the laminate film of the thermal oxidation film 211 and the CVD oxide film 304 constitutes a gate insulating film.

When the manufacturing process of this embodiment is employed. the density of boundary energy states at the boundary between the gate insulating film and the active layer can be made low.

Embodiment 3

This embodiment is directed to a manufacturing method of an active matrix circuit region of an active matrix liquid crystal display device.

FIGS. 4A–4D show a manufacturing process according to this embodiment. First, the state of FIG. 2D (also shown in FIG. 4A) is obtained by the process of the first embodiment.

Next, a 2,000-Å-thick silicon nitride film 401 as a first interlayer insulating film is formed by plasma CVD. A polyimide resin film 402 is formed thereon by spin coating, to obtain the state of FIG. 4B. Resin materials other than polyimide, such as polyamide, polyimideamide and acrylic resin, may also be used.

Figure 4A:
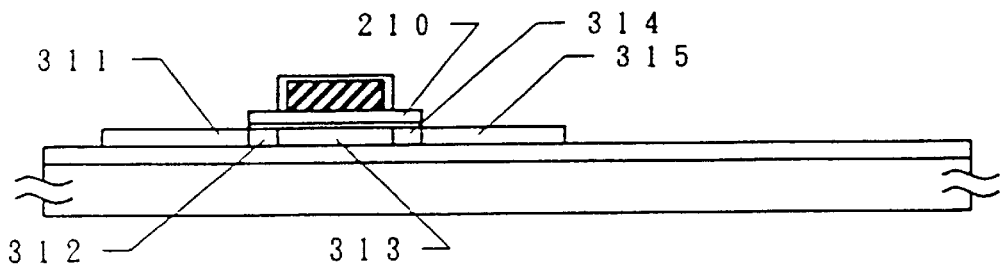
FIGS. 4A–4D show a manufacturing process of a TFT according to a third embodiment of the invention.
Figure 4B:
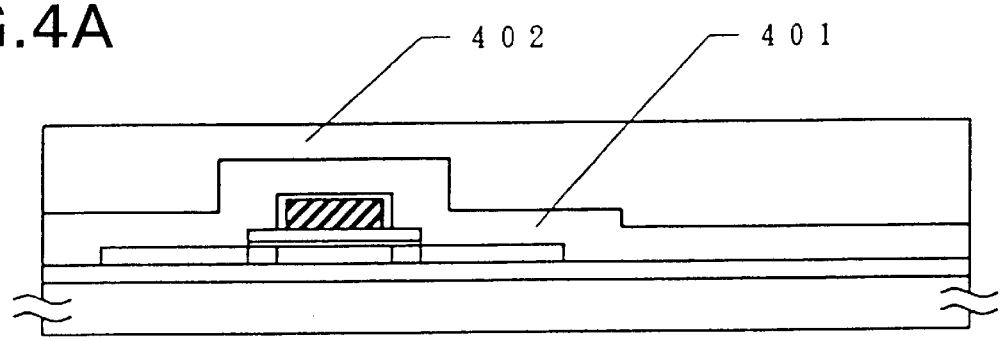
Figure 4C:
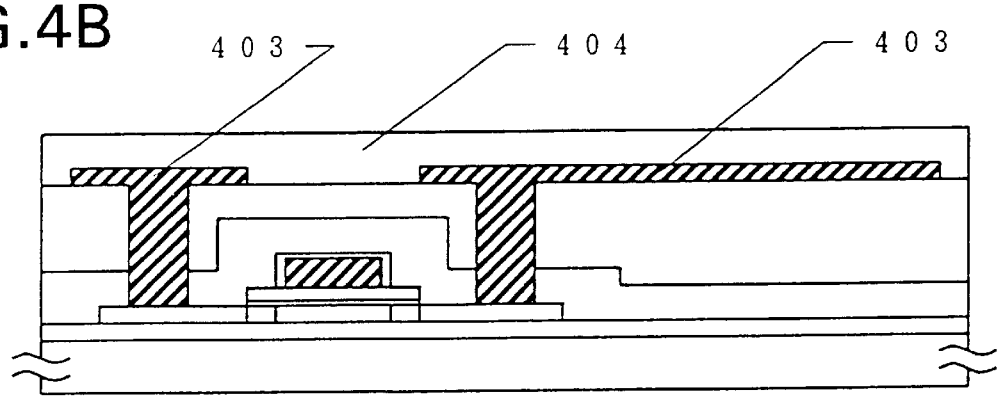
Figure 4D:
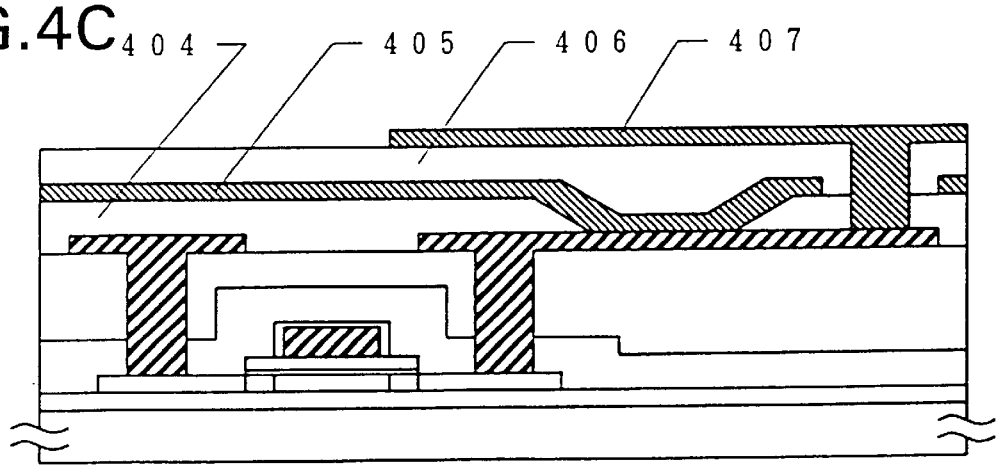

After contact holes are formed so as to reach the source region 311 and the drain region 315, a source electrode 403 and a drain electrode 403 are formed each of which is a laminate film of a titanium film, an aluminum film, and a titanium film. The source electrode 403 is so formed as to extend from a source line. (FIG. 4C).

Part of the source electrode 403 serves as an electrode for forming an auxiliary capacitor.

After the formation of the source and drain electrodes 403, a polyimide resin film 404 as a second interlayer insulating film is formed. Thus, the state of FIG. 4C is obtained.

Next, after an opening is formed through the resin interlayer insulating film 404, a black matrix (BM) 405 is formed which is a laminate film of a titanium film and an aluminum film. The black matrix 405 serves as an electrode for forming an auxiliary capacitor as well as a light-shielding film (primary function).

After the formation of the black matrix 405, a polyimide resin film 406 is formed as a third interlayer insulating film. Then, after a contact hole for the drain electrode 403 is formed, an ITO pixel electrode 407 is formed.

In this manner, there is obtained a structure in which the polyimide resin film 406 is interposed between pattern of the black matrix 405 serving as an auxiliary capacitor and the pixel electrode 407 pattern.

Embodiment 4

This embodiment is directed to a case where the method of forming a contact to the gate electrode or a gate line extending from the gate electrode is modified in the manufacturing method of the first embodiment.

In the first embodiment (see FIG. 2E) and the third embodiment (see FIG. 4D), both of the side face and the top face of the gate electrode are covered with the dense anodic oxide film.

This structure is very effective in suppressing the occurrence of hillocks and short-circuiting between wiring lines in the case of forming an electrode made of aluminum. However, this structure has a problem that it is relatively difficult to form a contact because the dense anodic oxide film is strong.

This embodiment is intended to solve this problem. FIGS. 5A–5E show a manufacturing process according to this embodiment. The detailed manufacturing conditions etc. for forming the components given the same reference numerals as the corresponding components in the other embodiments are the same as in those embodiments.

Figure 5A:
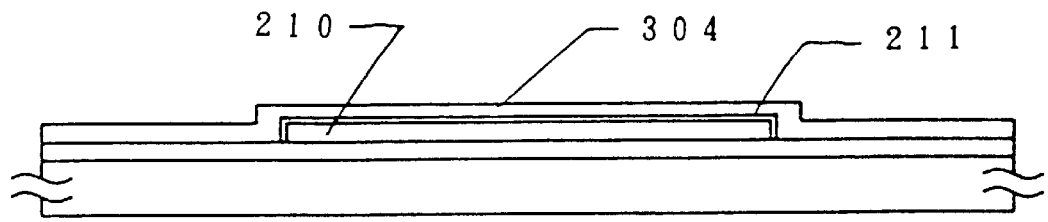
FIGS. 5A–5E show a manufacturing process of a TFT according to a fourth embodiment of the invention.

First, an active layer pattern 210 of a crystalline silicon film is formed as shown in FIG. 5A. Thereafter, a thermal oxidation film 211 and a CVD oxide film 304 are laid one on another. In this embodiment, the CVD oxide film 304 is formed first and then the thermal oxidation film 211 is formed.

Figure 5B:
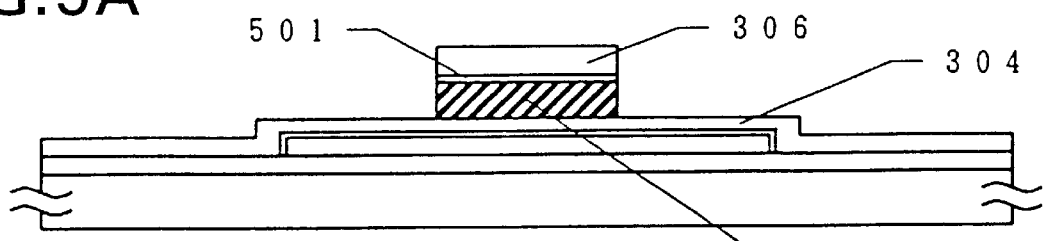

Once the state of FIG. 5A is obtained, an aluminum film is formed and a 500-Å-thick silicon nitride film is formed thereon. Then, patterning is performed by using a resist mask 306, to obtain an aluminum pattern 305 and a silicon nitride film 501 formed thereon. (FIG. 5B).

In this state, with the resist mask 306 left as it is, a porous anodic oxide film 308 is formed and subsequently a dense anodic oxide film 309 is formed.

These anodic oxide films 308 and 309 are selectively formed on the side face of the aluminum pattern 307 that will become a gate electrode. This is because the silicon nitride film 501 is formed on the top face of the aluminum pattern 307.

The resist mask 306 is then removed. Further, the exposed portions of the silicon oxide film 304 as well as parts of the thermal oxidation film 211 are removed.

Figure 5C:
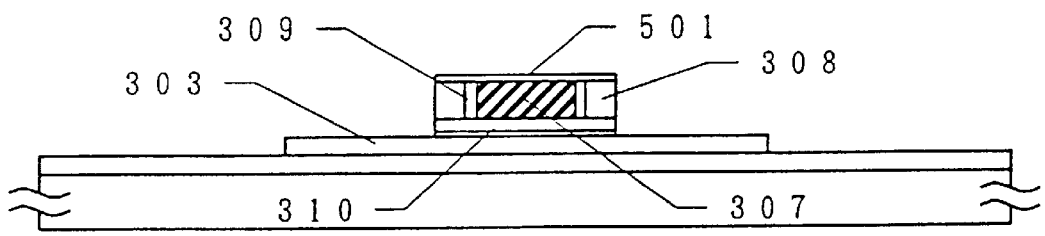

Thus, the state of FIG. 5C is obtained. Once this state is obtained, the porous anodic oxide film 308 is removed.

Figure 5D:
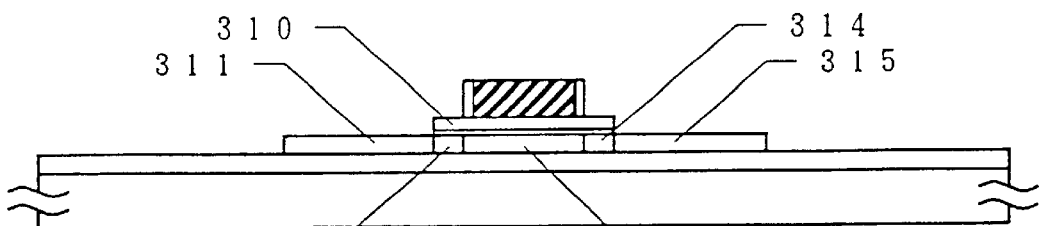

Further, the silicon nitride film 501 is removed to obtain the state of FIG. 5D. In this state, an impurity for imparting a proper conductivity type is implanted by plasma doping. As a result, a source region 311, low-concentration impurity regions 312 and 314, a channel-forming recion 313. and a drain region 315 are formed in a self-aligned manner.

After the impurity doping, laser light irradiation is performed to repair the doping damage (annealing) and activate the implanted impurity.

Thus, the state of FIG. 5D is obtained. Next, an interlayer insulating film 502 is formed. After contact holes are formed, a source electrode 317, a gate lead-out electrode 503, a drain electrode 318 are formed to obtain the state of FIG. 5E.

In this step, the contact hole for the gate electrode 307 can be formed relatively easily because no silicon oxide film exists on the top face of the gate electrode 307.

Figure 5E:
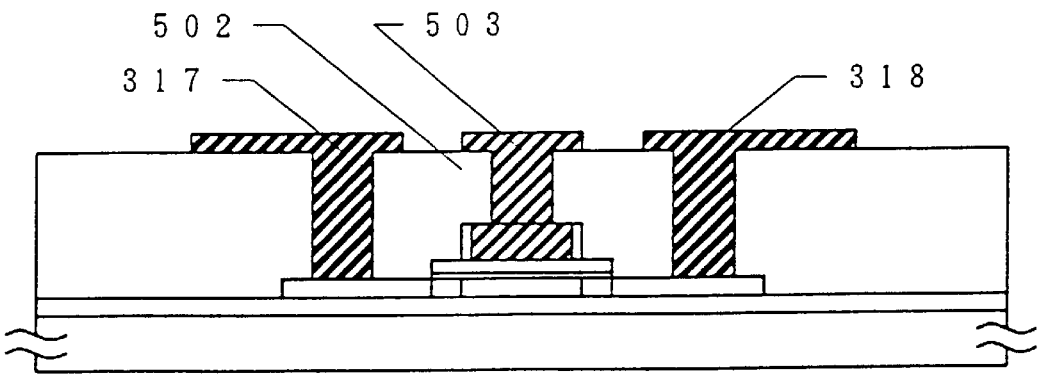

Although in FIG. 5E the source/drain electrodes 317 and 318 and the gate lead-out electrode 503 are drawn on the same cross-section, actually the gate lead-out electrode 503 is so formed as to be connected to an extension of the gate electrode 307.

Embodiment 5

This embodiment is directed to a case where a glass substrate is used in the manufacturing method of the first embodiment.

In this embodiment, a Corning 1737 glass substrate having a strain point of 667° C. is used. The heating treatment for crystallization is performed at 600° C. for 4 hours.

The heating treatment to form a thermal oxidation film is performed at 640° C. by an electrical furnace in an oxygen atmosphere containing HCl at 3 volume %. In this case, a resulting thermal oxidation film has a thickness of 30 Å when the processing time is 2 hours. The effects of the thermal oxidation film are smaller than in the case of the first embodiment (heat treatment temperature: 950° C.)

Embodiment 6

This embodiment is directed to a case where HCl is not contained in the atmosphere used in forming a thermal oxidation film in the manufacturing method of the first embodiment. In this case, the gettering effect of nickel is smaller than in the case where the atmosphere contains HCl.

Embodiment 7

This embodiment is directed to a case where laser light irradiation is performed after the formation of a thermal oxidation film in the manufacturing method of the first embodiment. This effectively improves the crystallinity.

Embodiment 8

This embodiment is examples of semiconductor devices using TFTs. FIGS. 8A–8F show various examples of semiconductor devices.

Figure 8A:
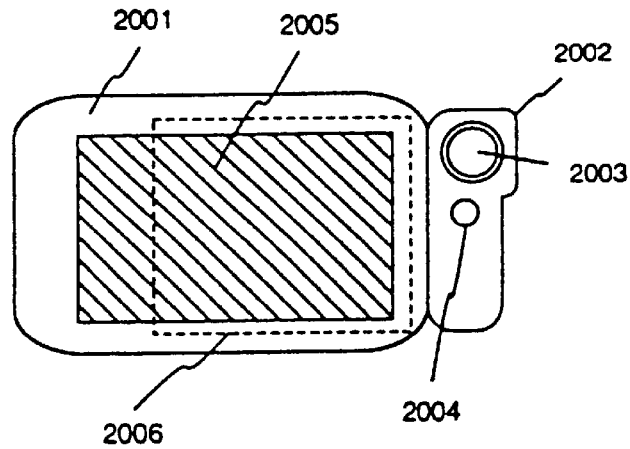
FIGS. 8A–8F schematically show various semiconductor devices using TFTs.

FIG. 8A shows a semiconductor device called a portable information terminal which can read necessary information from an internal storage device and display it on an active matrix liquid crystal display device 2005 that is incorporated in a main body 2001, or display information obtained by accessing it via telephone lines on the display device 2005.

An active matrix EL display device may be used instead of the liquid crystal display device 2005. Various information processing circuits and a storage circuit are formed on the same substrate as an active matrix circuit of the display device 2005 by using TFTs, to together constitute an integrated circuit 2006.

A camera section 2002 attached to a main body 2001 can take in necessary information upon a manipulation on an operation switch 2004. An image to be taken in by the camera section 2002 is supplied to the device through an image receiving section 2003.

Figure 8B:
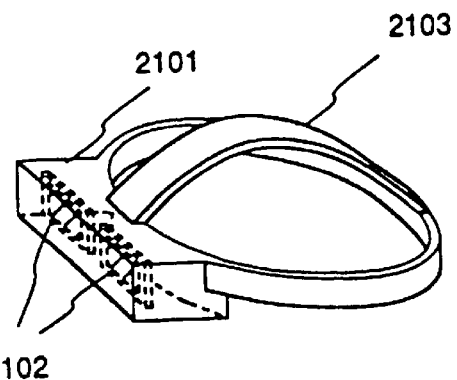

FIG. 8B shows a display device called a head-mount display. A main body 2101 of this device is mounted on the head of a user. This device has a function of displaying an image in front of the eyes several centimeters apart therefrom with two active matrix liquid crystal display devices 2102. This device allows the user to see a virtual image.

Figure 8C:
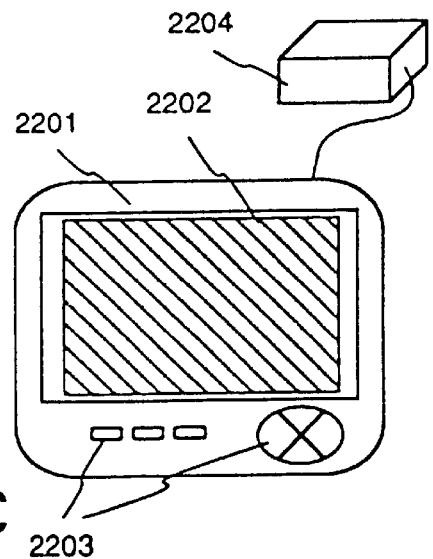

FIG. 8C shows a car navigation system. This device has a function of measuring the position by using a signal coming from an artificial satellite and received by an antenna 2204. The measured position is displayed on an active matrix liquid crystal display device 2202. Information to be displayed is selected by using operation switches 2203.

An active matrix EL display device may be used instead of the liquid crystal display device 2202.

Figure 8D:
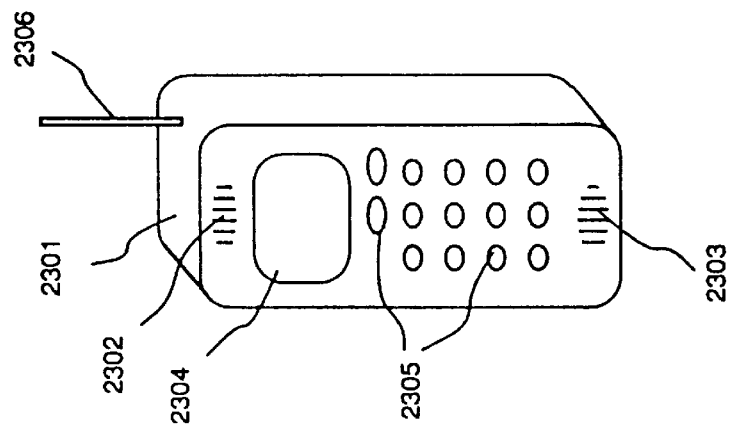

FIG. 8D shows a cellular telephone set. A main body 2301 is equipped with an antenna 2306, a voice input section 2303, and a voice output section 2302.

A user manipulates operation switches 2305 to make a call. Various types of image information are displayed on a display device 2304, which may be either an active matrix liquid crystal display device or an active matrix EL display device.

Figure 8E:
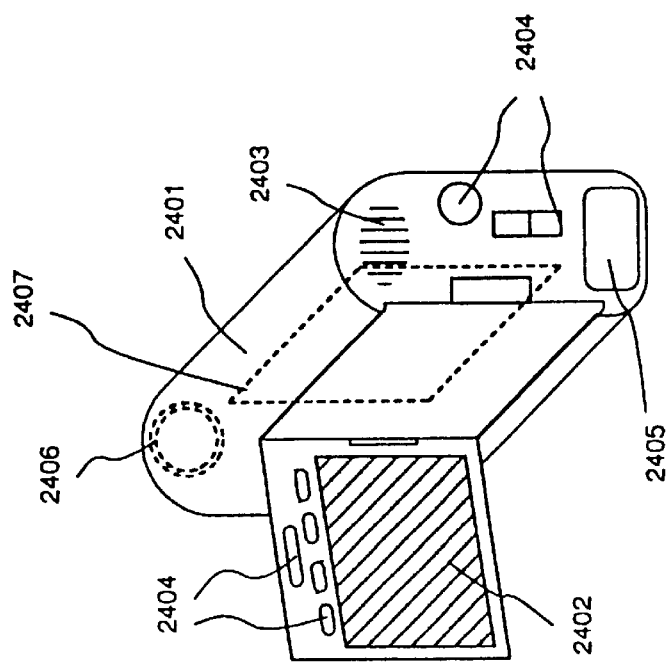

FIG. 8E shows a portable video camera. This device has a function of storing an image that is received by an image receiving section 2406 onto a magnetic tape that is incorporated in a main body 2401.

Various types of digital processing are performed on the image by an integrated circuit 2407. The integrated circuit 2407 may be a combination of conventional IC chips or may be constituted by using TFTs according to the invention. As a further alternative, the integrated circuit 2407 may be a combination of the above two types of configurations.

An image received by the image receiving section 2406 or stored in the internal magnetic tape is displayed on an active matrix liquid crystal display device 2402. Manipulations on the device are performed by using operation switches 2404. The device is powered by a battery 2405.

Figure 8F:
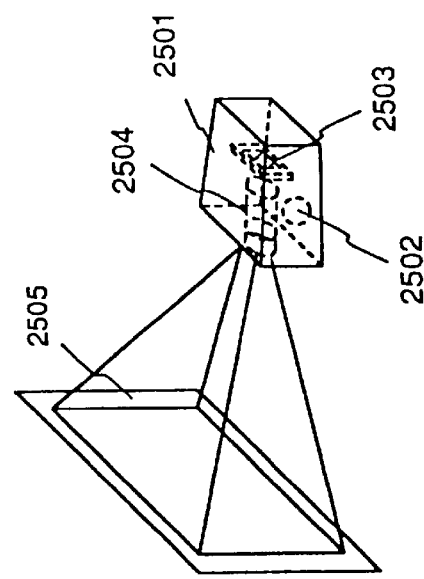

FIG. 8F shows a projection display device. This device has a function of projecting onto a screen 2505 an image produced by a main body 2501.

The main body 2501 has a light source 2502, an active matrix liquid crystal display device for forming an image by optically modulating light that is emitted from the light source 2502, and an optical system 2504 for projecting the image thus formed.

In the above devices, the liquid crystal display device may be either of a transmission type or of a reflection type except for the device of FIG. 8B.

A 9-stage ring oscillator was constructed by combining PTFTs and NTFTs produced according to the invention. Oscillation at more than 400 MHz was attained in this ring oscillator.

In view of the fact that actual circuits are generally designed frequency that is about 10% of the oscillation frequency of a ring oscillator, it is concluded that a circuit capable of operating at about 40 MHz can be constructed by using the above TFTs.

As exemplified above, the invention can provide TFTs which can constitute a circuit that is required to operate at high speed (in general, at more than several tens of megahertz).

In particular, the invention provides a very small S value less than 100 mV/dec.), which is equivalent to an S value of a MOS sistor formed on a single crystal silicon wafer.

The invention allows various circuits that are required to operate at high speed to be integrated on the same substrate by using TFTs. Further, the invention provides a manufacturing method of such a configuration.

What is claimed is:

1. A portable information terminal device having an active matrix EL display device, said display device comprising:
   a substrate having an insulating surface;
   a plurality of pixels arranged in a matrix form; and
   a plurality of thin transistors disposed at said pixels,
   wherein each of said thin film transistors has a channel region comprising crystalline silicon and an S-value not larger than 100 mV/dec.

2. A device according to claim 1, wherein said channel region comprising crystalline silicon is crystallized utilizing a material for accelerating crystallization of silicon.

3. A device according to claim 1, further comprising an interlayer insulating film comprising a silicon nitride formed over said plurality of thin film transistors.

4. A device according to claim 1, further comprising an interlayer insulating film comprising a resin formed over said plurality of thin film transistors.

5. A device according to claim 1, wherein said portable information terminal device reads information from an internal storage device via a telephone line.

6. A head-mount display device having an active matrix EL display device, said display device comprising:
   a substrate having an insulating surface;
   a plurality of pixels arranged in a matrix form; and
   a plurality of thin film transistors disposed at said pixels,
   wherein each of said thin film transistors has a channel region comprising crystalline silicon and an S-value not larger than 100 mV/dec.

7. A device according to claim 6, wherein said channel region comprising crystalline silicon is crystallized utilizing a material for accelerating crystallization of silicon.

8. A device according to claim 6, further comprising an interlayer insulating film comprising a silicon nitride formed over said plurality of thin film transistors.

9. A device according to claim 6, further comprising an interlayer insulating film comprising a resin formed over said plurality of thin film transistors.

10. A device according to claim 6, wherein said head-mount display device is mounted on a head of a user and displays a virtual image in front of user's eyes.

11. A car navigation system having an active matrix EL display device, said display device comprising:
   a substrate having an insulating surface;
   a plurality of pixels arranged in a matrix form; and
   a plurality of thin film transistors disposed at said pixels,
   wherein each of said thin film transistors has a channel region comprising crystalline silicon and an S-value not larger than 100 mV/dec.

12. A system according to claim 11, wherein said channel region comprising crystalline silicon is crystallized utilizing a material for accelerating crystallization of silicon.

13. A system according to claim 11, further comprising an interlayer insulating film comprising a silicon nitride formed over said plurality of thin film transistors.

14. A system according to claim 11, further comprising an interlayer insulating film comprising a resin formed over said plurality of thin film transistors.

15. A system according to claim 11, wherein said car navigation system measures a position by receiving a signal coming from an artificial satellite.

16. A cellular telephone device having an active matrix EL display device, said display device comprising:
   a substrate having an insulating surface;
   a plurality of pixels arranged in a matrix form; and a plurality of thin film transistors disposed at said pixels,
wherein each of said thin film transistors has a channel region comprising crystalline silicon and an S-value not larger than 100 mV/dec.

17. A device according to claim 16, wherein said channel region comprising crystalline silicon is crystallized utilizing a material for accelerating crystallization of silicon.

18. A device according to claim 16, further comprising an interlayer insulating film comprising a silicon nitride formed over said plurality of thin film transistors.

19. A device according to claim 16, further comprising an interlayer insulating film comprising a resin formed over said plurality of thin film transistors.

20. A device according to claim 16, wherein said cellular telephone device further comprises an antenna, a voice input, a voice output, and operation switches to make a call.

21. A portable video camera device having an active matrix EL display device, said display device comprising:
   a substrate having an insulating surface;
   a plurality of pixels arranged in a matrix form; and
   a plurality of thin film transistors disposed at said pixels,
   wherein each of said thin film transistors has a channel region comprising crystalline silicon and an S-value not larger than 100 mV/dec.

22. A device according to claim 21, wherein said channel region comprising crystalline silicon is crystallized utilizing a material for accelerating crystallization of silicon.

23. A device according to claim 21, further comprising an interlayer insulating film comprising a silicon nitride formed over said plurality of thin film transistors.

24. A device according to claim 21, further comprising an interlayer insulating film comprising a resin formed over said plurality of thin film transistors.

25. A device according to claim 21, wherein said portable video camera device stores an image received by an image receiving section onto a magnetic tape.

26. A projection display device having an active matrix EL display device, said display device comprising:
   a substrate having an insulating surface;
   a plurality of pixels arranged in a matrix form; and
   a plurality of thin film transistors disposed at said pixels,
   wherein each of said thin film transistors has a channel region comprising crystalline silicon and an S-value not larger than 100 mV/dec.

27. A device according to claim 26, wherein said channel region comprising crystalline silicon is crystallized utilizing a material for accelerating crystallization of silicon.

28. A device according to claim 26, further comprising an interlayer insulating film comprising a silicon nitride formed over said plurality of thin film transistors.

29. A device according to claim 26, further comprising an interlayer insulating film comprising a resin formed over said plurality of thin film transistors.

30. A device according to claim 26, wherein said projection display device projects an image formed therein onto a screen.

* * * * *